United States Patent
Häfner et al.

(10) Patent No.: US 8,848,322 B2
(45) Date of Patent: Sep. 30, 2014

(54) GATE CONTROL CIRCUIT, POWER MODULE AND ASSOCIATED METHOD

(75) Inventors: Jürgen Häfner, Ludvika (SE); Willy Hermansson, Västerås (SE)

(73) Assignee: ABB Research Ltd, Zürich (CH)

( * ) Notice: Subject to any disclaimer, the term of this patent is extended or adjusted under 35 U.S.C. 154(b) by 0 days.

(21) Appl. No.: 14/127,877

(22) PCT Filed: Jun. 20, 2011

(86) PCT No.: PCT/EP2011/060239
§ 371 (c)(1),
(2), (4) Date: Mar. 10, 2014

(87) PCT Pub. No.: WO2012/175109
PCT Pub. Date: Dec. 27, 2012

(65) Prior Publication Data
US 2014/0168840 A1   Jun. 19, 2014

(51) Int. Cl.
*H02H 3/18* (2006.01)
*H02H 9/02* (2006.01)
*H03K 17/18* (2006.01)
*H02M 1/32* (2007.01)

(52) U.S. Cl.
CPC ............. *H02H 9/02* (2013.01); *H03K 17/18* (2013.01); *H02M 1/32* (2013.01)
USPC ............................................. 361/18; 361/87

(58) Field of Classification Search
CPC ............ H03K 17/18; H02M 1/32; H02H 3/08
USPC ........................................ 361/18, 86, 87, 91.1
See application file for complete search history.

(56) References Cited

U.S. PATENT DOCUMENTS 8,027,132 B2 *  9/2011  Omaru .................. 361/93.1
2009/0014669 A1  1/2009  Sato et al.

FOREIGN PATENT DOCUMENTS

| EP | 0 517 261 A2 | 12/1992 |
| EP | 0 618 679 A1 | 10/1994 |
| EP | 0 785 625 A2 | 7/1997 |
| EP | 1 786 105 A2 | 5/2007 |
| EP | 2 330 740 A1 | 6/2011 |
| WO | WO 2004/049571 A1 | 6/2004 |

* cited by examiner

*Primary Examiner* — Danny Nguyen
(74) *Attorney, Agent, or Firm* — Birch, Stewart, Kolasch & Birch, LLP

(57) ABSTRACT

It is presented a gate control circuit comprising: a main gate unit arranged to supply, via a plurality of main gate unit outputs, a gate signal to respective gates of a plurality of power switches, for controlling a main current; and an auxiliary gate unit comprising an optical power converter for converting incoming optical power to an auxiliary electrical gate signal. The auxiliary gate unit is arranged to, when a failure occurs in one of the plurality of power switches, provide the auxiliary electrical gate signal to respective gates of any of the plurality of power switches still being in operation. A corresponding power module and method are also presented.

17 Claims, 4 Drawing Sheets

GATE CONTROL CIRCUIT, POWER MODULE AND ASSOCIATED METHOD

TECHNICAL FIELD

The invention relates to control of power switches used to control a current of a main circuit when a failure occurs.

BACKGROUND

As known in the art, short circuit failure mode (SCFM) provides predictable behaviour for a power switch module in case one or more individual power switches (e.g. Insulated-Gate Bipolar Transistors, IGBTs) fail. As long as a sufficient number of other power switch modules are operational, typically serially connected with the IGBT module containing the failed power switch, the application can still function. This can continue until the failed power switch or power switch module is replaced or repaired.

A gate unit can be provided to provide a suitable signal to the power switches based on a control signal provided to the power module.

The gate unit can be powered from the main circuit, and can have components to continue powering the gate unit while the power switch position is temporarily in none-conductive state. However, a short-circuited, faulty power switch will eventually result in a power shutdown of the gate unit, making control of the remaining functional power switches difficult or impossible.

SUMMARY

An object is to provide a robust way to implement short circuit failure mode for a power module where the gate unit is powered from the main circuit.

According to a first aspect, it is presented a gate control circuit comprising: a main gate unit arranged to supply, via a plurality of main gate unit outputs, a gate signal to respective gates of a plurality of power switches, for controlling a main current; and an auxiliary gate unit comprising an optical power converter for converting incoming optical power to an auxiliary electrical gate signal. The auxiliary gate unit is arranged to, when a failure occurs in one of the plurality of power switches, provide the auxiliary electrical gate signal to respective gates of any of the plurality of power switches still being in operation. By powering the auxiliary gate unit from the optical power, short circuit failure mode is ensured for the remaining, operating power switches, independently from the main circuit. As long as the source of the optical power is functioning, this can continue for a long period, e.g. until the failed power switch can be replaced.

The auxiliary gate unit may comprise a plurality of auxiliary gate unit resistors provided between the optical power converter and respective outputs for each of the plurality of power switches, wherein each one of the plurality of auxiliary gate unit resistors is sufficiently large to keep a gate voltage of operating power switches such that the respective operating power switch conducts. This prevents the failed power switch from collecting all the power from the optical power, so that sufficient voltage can be provided to the remaining, operating, power switches to be set in a conducting state.

The main gate unit may further comprise a plurality of main gate unit resistors respectively connected to each main gate unit output, wherein the resistance of each main gate unit resistor is significantly lower than the resistance of each auxiliary gate unit resistor. This allows fast response for the main gate unit driver, and continuous connection of the auxiliary gate unit driver.

The main gate unit may comprise a plurality of output switches arranged to disconnect the plurality of main gate unit outputs from each other. Particularly in the situation that there is a low resistance to each gate from the main gate unit, this prevents a failed power switch from pulling down the voltage of remaining, operating power switches.

The output switches may respectively comprise a transistor arranged to become non-conducting when the main gate unit becomes powerless. In this way, a control signal to set the output switches in a blocking state becomes optional.

The auxiliary gate unit may comprise a control switch selectively operable by a controller to make the auxiliary gate unit provide the auxiliary electrical gate signal to any of the plurality of power switches still being in operation.

The auxiliary gate unit may comprise a capacitor connected to the optical power converter. The capacitor reduces temporary variations in voltage from the optical power converter.

A second aspect is a power module comprising: a gate control circuit according to the first aspect; and a plurality of power switches connected to the gate control circuit.

Each one of the plurality of power switches may comprise an insulated-gate bipolar transistor.

A third aspect is a method executed in a gate control circuit comprising: a main gate unit arranged to supply, via a plurality of main gate unit outputs, a gate signal to respective gates of a plurality of power switches, for controlling a current of the main circuit; and an auxiliary gate unit comprising an optical power converter for converting incoming optical power to an auxiliary electrical gate signal. The method comprises the step of: when a failure occurs in one of the plurality of power switches, providing the auxiliary electrical gate signal to respective gates of any of the plurality of power switches still being in operation.

It is to be noted that any feature of the first, second or third aspects may, when suitable, be applied to any other of these aspects.

The word 'plurality' in the description and claims is to be interpreted as meaning 'more than one'.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figures 1A, 1B:
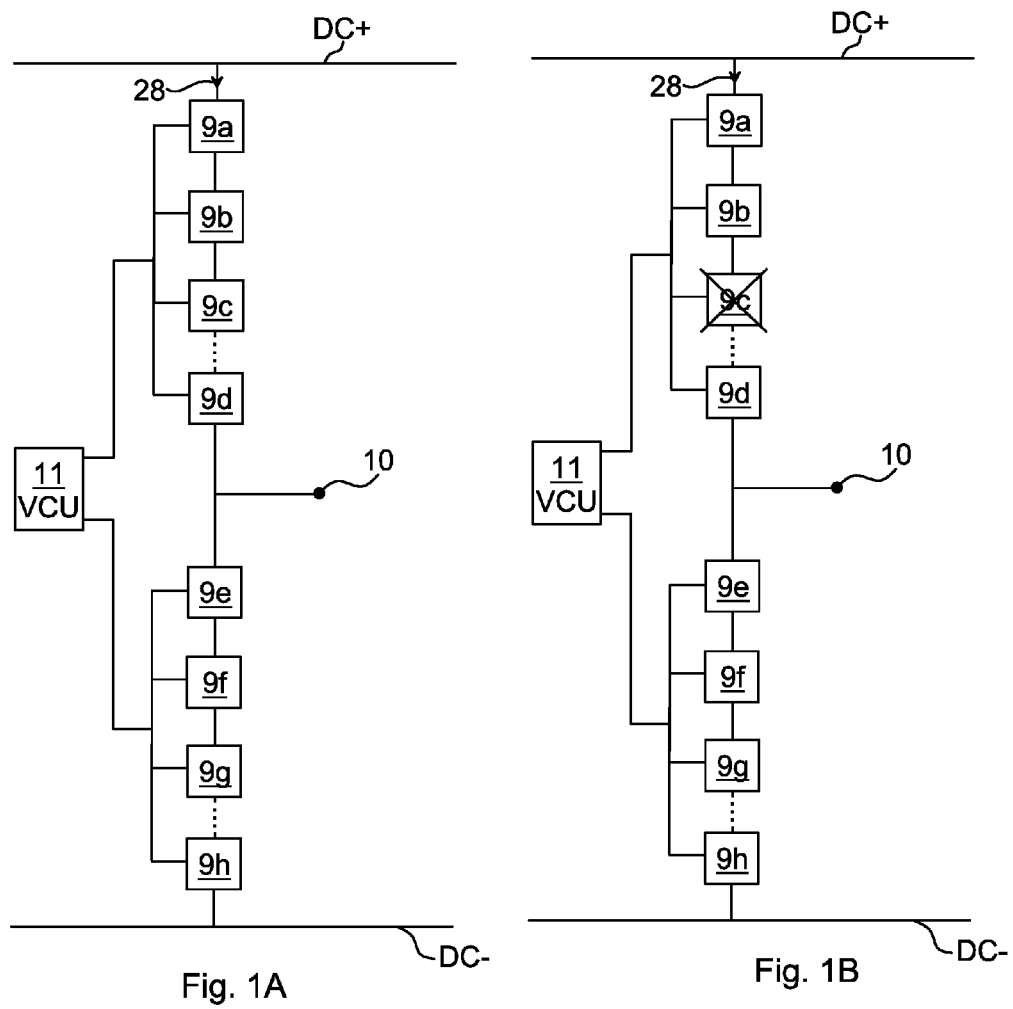
FIGS. 1A-B are schematic diagrams illustrating an environment where embodiments of the present invention can be applied.

FIGS. 1A-B are schematic diagrams illustrating an environment where embodiments of the present invention can be applied. A bridge leg in an inverter is shown for one phase. Additional phases (such as for a three phase system) are configured in the same way. DC power is supplied using a positive DC bus DC+ and a negative DC bus DC−. A valve control unit (VCU) 11 is connected to a plurality of power modules 9a-h to control a main current 28 of a main circuit through the power modules 9a-h. An upper part of the bridge leg comprises a first set of power modules 9a-9d, and a lower part of the bridge leg comprises a second set of power modules 9e-h. The first set of power modules 9a-9d are controlled by a first control signal from the VCU 11 and the second set of power modules 9e-9h are controlled by a second control signal from the VCU 11. This allows the VCU to e.g. effect pulse width modulation (PWM) to supply an alternating current to an output 10. By placing several power modules 9a-d, 9e-h in series, high voltage applications can be supported. It is to be noted that the number of power modules shown here is only an example and any suitable number of power modules can be used.

If now one power module fails, such as power module 9c of FIG. 1B, the circuit can still work as desired if the failed power module is set to conduct in a short circuit mode. When a failure is detected in the power module, it is ensured that it is set to a short circuit failure mode where it continuously conducts. In other words, regardless of the signal from the VCU 11, the failed power module 9c will conduct. As long as there is some over-dimensioning in this configuration, the remaining power modules 9a-b, 9d-h operate as usual and provides the desired function until the failed power module 9c is replaced or repaired.

Another risk with a failed power module is that a discharge can occur if the failed power module breaks the circuit, which can lead to additional failed components and even fires.

There are many other topologies, such as H-bridge, half bridge, etc. where the same idea is useful, i.e. when a power module fails it should be set to a conducting state.

Figure 2A:
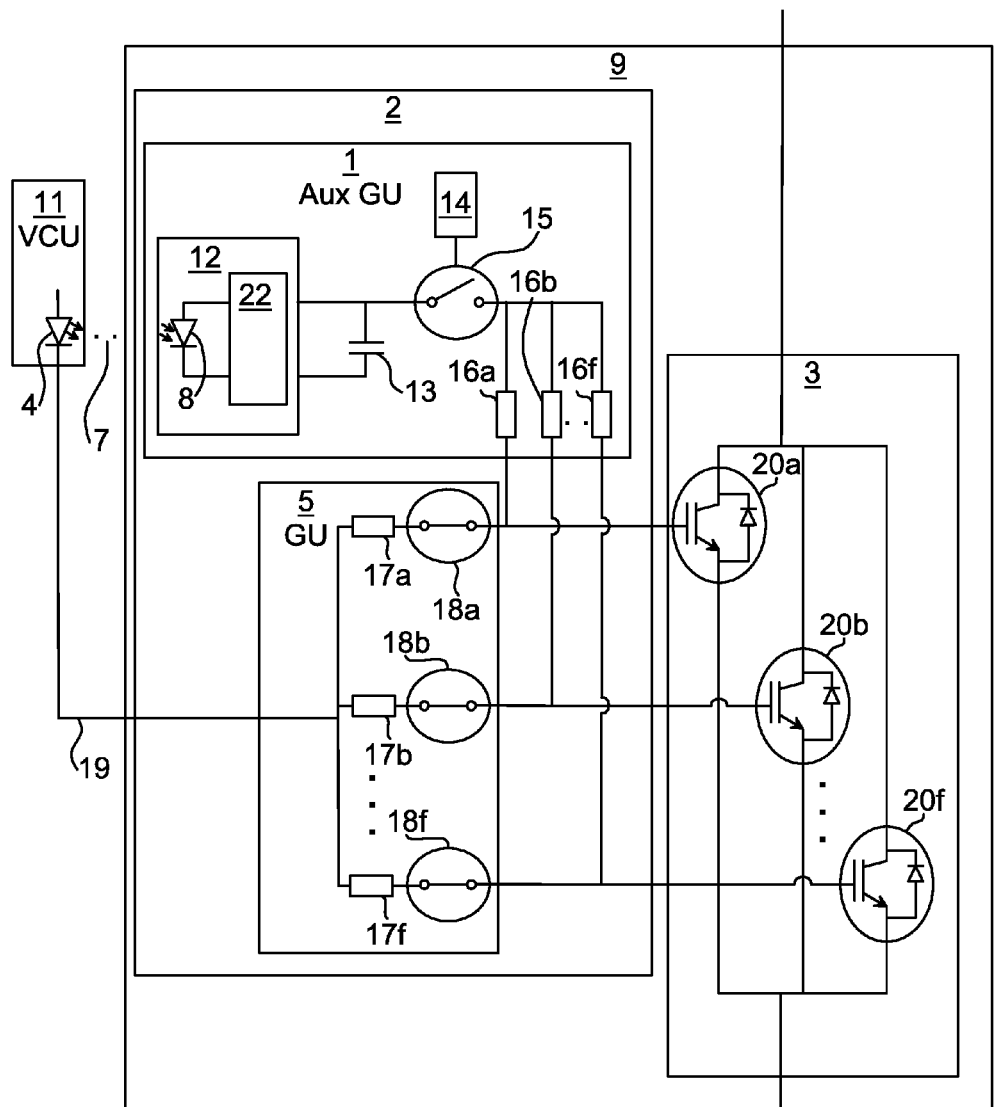
FIG. 2A is a schematic diagram illustrating components and interfaces of one of the power modules of FIGS. 1A and 1B when all power switches are operational.
Figure 2B:
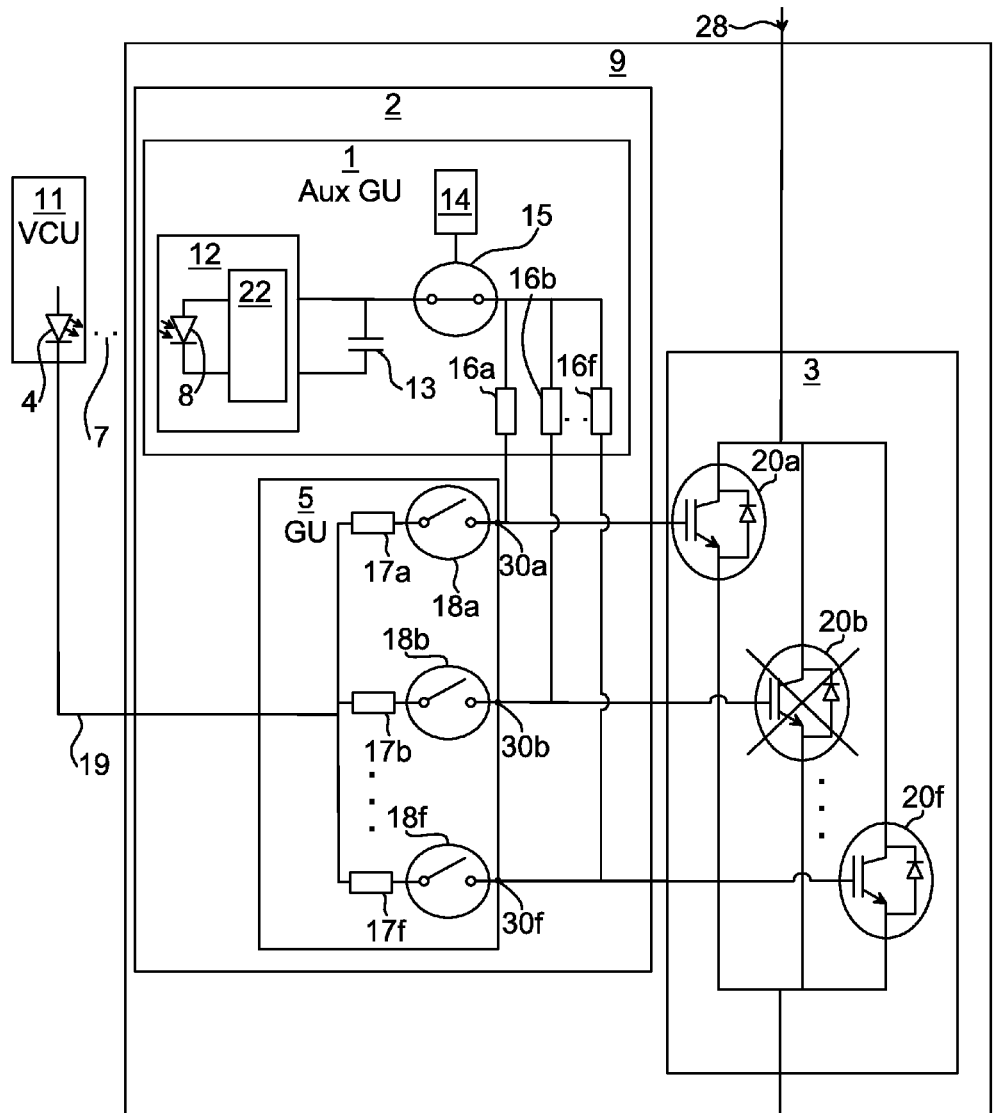
FIG. 2B is a schematic diagram illustrating components and interfaces of one of the power modules of FIGS. 1A and 1B when one of the power switches has failed.

FIGS. 2A and 2B are schematic diagrams illustrating components and interfaces of one of the power modules of FIGS. 1A and 1B when all power switches are operational, and when one power switch has failed, respectively. All power modules 9a-h of FIGS. 1A-B can have the same configuration. The power module 9 comprises a gate control circuit 2 and a power switch module 3.

The power switch module 3 comprises a set of power switches 20a-f performing the actual switching of the main circuit as explained with reference to FIGS. 1A and 1B above. The power switches 20a-f are here provided in parallel to support a sufficiently large current. Any suitable number of power switches 20a-f can be provided. In this example, six power switches 20a-f are provided. The power switches 20a-f can be any suitable power switches, e.g. IGBTs.

The gate control circuit 2 comprises a main gate unit 5 and an auxiliary gate unit 1, both connected to the gates of the power switches 20a-f of the power switch module 3.

The main gate unit 5 receives a control signal from the VCU 11. The control signal can either be that the power switches 20a-f are to be in a conducting state or that the power switches 20a-f are to be in a blocking state. The main gate unit 5 can be powered from the same source as the main circuit, e.g. using the voltage across the power switch module 3 when the power switches 20a-f are in a blocking state.

The main gate unit 5 comprises a plurality of main gate unit outputs 30a-f connected to respective gates of the power switches 20a-f. For each main gate unit output 30a-f, a respective main gate unit resistor 17a-f and a respective output switch 18a-f are provided within the main gate unit 5. The output switches 18a-f can for example be MOSFETs (Metal-Oxide-Semiconductor Field-Effect Transistors) or other transistors. The output switches 18a-f can be powered from the same power source as the rest of the main gate unit 5, whereby if the main gate unit 5 loses power, the output switches 18a-f also lose power and thereby disconnect. In other words, these output switches 18a-f are of the type normally off.

The main gate unit 5 receives the control signal via a connection 19 to the valve control unit 11. The connection 19 can be an optical connection or a galvanic connection.

There can be other components of the main gate unit 5, but these are not shown here in order not to obscure the presented embodiment.

The auxiliary gate unit 1 has a number of auxiliary gate unit outputs respectively connected to the gates of the power switches 20a-f. The number of auxiliary gate unit outputs corresponds to the number of power switches 20a-f. For each auxiliary gate unit output, the auxiliary gate unit 1 comprises a respective auxiliary gate unit resistor 16a-f. A control switch 15 is selectively operable such that the auxiliary gate unit 1 can provide a gate signal or not.

The VCU 11 comprises a light emitting diode (LED) 4, e.g. a laser diode. The LED 4 can send light to auxiliary gate unit 1 via optical transfer conduit 7 and optionally also the main gate unit 5. The optical transfer conduit 7 can be an optical fibre and can optionally be combined with an optical fibre which is used to send control signals between the VCU 11 and the main gate unit 5.

The auxiliary gate unit 1 comprises an optical power converter 12 which is capable of converting incoming optical power from the LED 4 to an auxiliary electrical gate signal.

The optical power converter 12 comprises a photodiode 8 and a converter 22. The converter 22 comprises necessary circuitry to convert the electrical power from the photodiode 8 to suitable voltage for driving the gates of the power switches 20a-f. For example, the voltage level can be a few volts, e.g. in the range of 3 to 25 volts, or when IGBTs are used as power switches, the voltage level can be in the region of 10 to 20 volts. A smoothing capacitor 13 is provided to even out variations in voltage.

In FIG. 2A, all power switches 20a-f are operational. The main gate unit 5 is also fully operational and is powered from the main circuit. Hence, since there is power supplied to the main gate unit 5, the output switches 18a-f are in a conducting state.

FIG. 2B shows a scenario where a failure has occurred in one power switch 20b, i.e. there is a failed power switch 20b. The failed power switch 20b makes the main gate unit 5 powerless, since the failed power switch 20b can cause a very low voltage across the power switch module 3, preventing the provision of power from the voltage across the power switch module to the gate unit 5. Consequently, the output switches 18a-f assume a blocking state. This prevents a current between gates through the main gate unit 5.

The controller of the auxiliary gate unit 1 senses the failure of the failed power switch 20b, and controls the control switch 15 to assume a conducting state. The power supplied through the optical transfer conduit 7 is sufficient to keep the voltage of the gates of the operating power switches at a voltage to make them conduct. No switching is performed, which further reduces power requirements compared to normal operational state. In other words, the auxiliary gate unit 1 keeps the remaining, operating, power switches in short circuit failure mode using the auxiliary electrical gate signal.

The main gate unit 5 can actively drive the control switch 15 to be blocking, where the control switch is of type normally on. Thus, if the main gate unit 5 loses power, e.g. by the voltage across the power switch module 3 dropping, the control switch 15 becomes conducting. The capacitor 13 is precharged from when the main gate unit is operational.

It is possible that the gate and the emitter of the failed power switch 20b are short circuited. The auxiliary gate unit resistor 16a-f is dimensioned sufficiently large to keep a gate voltage of operating power switches such that the respective operating power switch conducts. In other words, the voltage difference from the gate of the failed power switch 20b, through the auxiliary gate unit resistor 16b corresponding to the failed power switch 20b, and through the auxiliary gate unit resistors to the respective gates of remaining, operating, power switches, is sufficient to keep the remaining, operating, power switches in a conducting state.

Moreover the resistance of the main gate unit resistors 17a-f is significantly lower to achieve fast response during normal operation. In this way, the auxiliary gate unit 1 can optionally be connected continuously, in a standby mode, during normal operation. In such an embodiment, the control switch 14 and the controller 15 are optional. The high ohmic gate driver of the auxiliary gate unit 5 will just result in a slower—but still sufficient—response of the auxiliary gate unit 1, compared to the shorter regular response times of the main gate unit 5.

One option of how to use the auxiliary gate unit 1 is to shutdown the LED 4 for powering the auxiliary gate unit 1 of the VCU 11 during normal operation. This will expand lifetime, and thus reliability, of the LED significantly.

Optionally, the main gate unit 5 powers and supervises the auxiliary gate unit 1 during normal operation. This can be implemented, e.g. by checking the functionality of the optical power supply 11, including the optical transfer conduit 7, occasionally by energising the laser diode 4 during short time intervals. The existing connection 19 of the main gate unit 5 or an additional auxiliary optical fibre may be used to supervise, and if desired to control, the optical output power of the LED 4.

Figure 3:
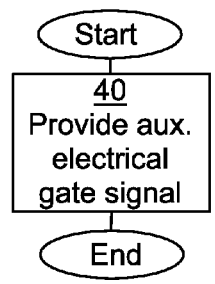
FIG. 3 is a flow chart illustrating a method performed using a gate control circuit of FIG. 2.

FIG. 3 is a flow chart illustrating a method performed using a gate control circuit of FIG. 2. The method is started when a power switch fails and the situation needs to be handled.

In a provide aux. electrical gate signal step 40, the auxiliary electrical gate signal is provided to respective gates of any of the plurality of power switches still being in operation.

Figure 4:
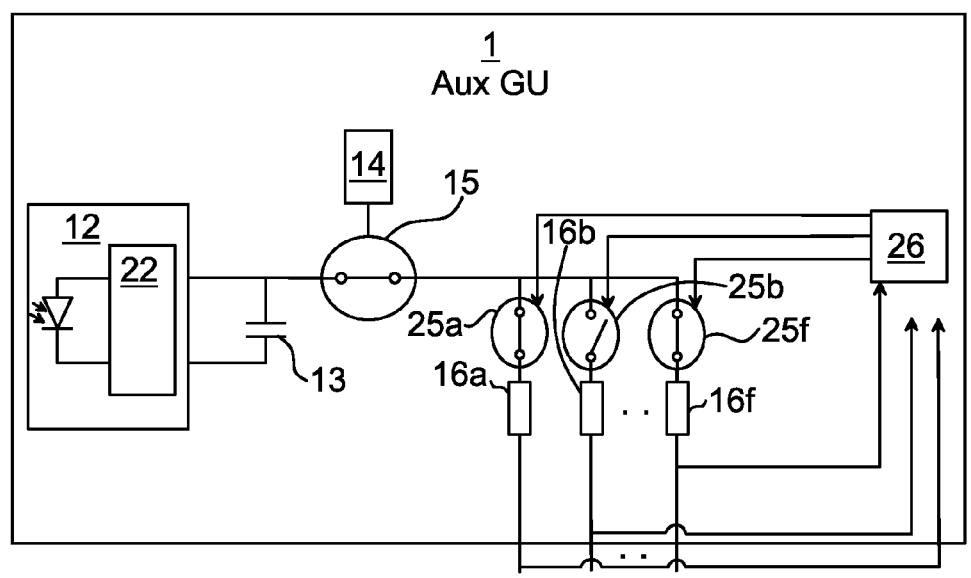
FIG. 4 is a schematic drawing of one embodiment of the auxiliary gate unit of FIG. 2A-B.

FIG. 4 is a schematic drawing of one embodiment of the auxiliary gate unit of FIG. 2A-B. Here, a plurality of gate switches 25a-f are provided for selectively preventing or allowing the provision of the auxiliary electrical gate signal to the respective gates of the power switches (not shown here, see FIGS. 2A-B). The gate switches 25a-f are controlled by a gate supervisor 26. The gate supervisor 26 is further connected such that it can detect the gate voltage for each connected gate of respective power switches.

The gate supervisor 26 can be provided as part of the auxiliary gate unit 1 or external (not shown) to the auxiliary gate unit 1, still within the gate control circuit 2.

When a power switch 20a-f fails, the gate voltage typically drops. If the gate voltage falls below a threshold voltage, the gate supervisor 26 disconnects the switch which is connected to the gate with the falling voltage. In this way, the gate of the failed power switch is disconnected, whereby no power is transferred to the failed power switch. In this way, the auxiliary gate unit resistors 16a-f can be provided with a lower resistance, or the auxiliary gate unit resistors 16a-f may even be omitted, as long as there is some resistance or other voltage drop through the gate switches 25a-f. This is due to there being a need to detect different voltages between gates of failed and operational power switches. Consequently, if the power switch has failed to the extent that the gate is short circuited, no current will be supplied to the failed power switch, which further reduces power requirements when in SCFM.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A gate control circuit comprising:
a main gate unit arranged to supply, via a plurality of main gate unit outputs, a gate signal to respective gates of a plurality of parallel power switches of a main circuit, for controlling switching of the power switches;
an auxiliary gate unit comprising an optical power converter for converting incoming optical power to an auxiliary electrical gate signal and arranged to, when a short-circuit failure occurs in one of the plurality of power switches, provide the auxiliary electrical gate signal to respective gates of any of the plurality of power switches still being in operation;
a plurality of gate switches for preventing the provision of the auxiliary electrical gate signal to the respective gates of any switches no longer being in operation, and
a gate supervisor connected to the plurality of gate switches, the gate supervisor being arranged to disconnect the gate switch connected to a gate for which the gate supervisor detects a gate voltage drop below a threshold voltage due to a power switch failure,
wherein the auxiliary gate unit comprises a plurality of auxiliary gate unit resistors provided between the optical power converter and respective outputs for each of the plurality of power switches,
each one of the plurality of auxiliary gate unit resistors is sufficiently large to keep a gate voltage of operating power switches such that the respective operating power switch conducts,
the main gate unit further comprises a plurality of main gate unit resistors respectively connected to each main gate unit output, wherein the resistance of each main gate unit resistor is significantly lower than the resistance of each auxiliary gate unit resistor, and
a plurality of output switches connected to the respective gates of the plurality of the parallel power switches and arranged to assume a blocking state when a failure has occurred in one power switch.

2. The gate control circuit according to claim 1, wherein the output switches respectively comprise a transistor arranged to become non-conducting when the main gate unit becomes powerless.

3. The gate control circuit according to claim 1, wherein the auxiliary gate unit comprises a control switch selectively operable by a controller to make the auxiliary gate unit provide the auxiliary electrical gate signal to any of the plurality of power switches still being in operation.

4. The gate control circuit according to claim 1 wherein the auxiliary gate unit comprises a capacitor connected to the optical power converter.

5. The gate control circuit according to claim 1 wherein the main gate unit is arranged to be powered by the main circuit.

6. A power module comprising:
   a gate control circuit according to claim 1; and
   a plurality of parallel power switches connected to the gate control circuit.

7. The power module according to claim 6, wherein each one of the plurality of power switches comprises of an insulated-gate bipolar transistor.

8. The gate control circuit according to claim 2, wherein the auxiliary gate unit comprises a control switch selectively operable by a controller to make the auxiliary gate unit provide the auxiliary electrical gate signal to any of the plurality of power switches still being in operation.

9. The gate control circuit according to claim 2 wherein the auxiliary gate unit comprises a capacitor connected to the optical power converter.

10. The gate control circuit according to claim 3 wherein the auxiliary gate unit comprises a capacitor connected to the optical power converter.

11. The gate control circuit according to claim 2 wherein the main gate unit is arranged to be powered by the main circuit.

12. The gate control circuit according to claim 3 wherein the main gate unit is arranged to be powered by the main circuit.

13. The gate control circuit according to claim 4 wherein the main gate unit is arranged to be powered by the main circuit.

14. A power module comprising:
   a gate control circuit according to claim 2; and
   a plurality of parallel power switches connected to the gate control circuit.

15. A power module comprising:
   a gate control circuit according to claim 3; and
   a plurality of parallel power switches connected to the gate control circuit.

16. A power module comprising:
   a gate control circuit according to claim 4; and
   a plurality of parallel power switches connected to the gate control circuit.

17. A power module comprising:
   a gate control circuit according to claim 5; and
   a plurality of parallel power switches connected to the gate control circuit.

* * * * *